United States Patent [19]

Chavez et al.

[11] 4,300,059
[45] Nov. 10, 1981

[54] SEQUENTIAL LOGICAL ELECTRONIC CIRCUIT CONTROLLING THE DISCHARGE OF CONTROLLABLE SEMICONDUCTORS

[76] Inventors: Ramon G. Chavez, Av. Circumvalacion diornte #177; Rodolfo A. V. Polido, Av. de les Maestros No. 1460, both of Sector Hidalgo Guadalajara, Jal., Mexico

[21] Appl. No.: 35,845

[22] Filed: May 4, 1979

[30] Foreign Application Priority Data

May 12, 1978 [MX] Mexico .................................. 173499

[51] Int. Cl.$^3$ ...................... H03K 17/56; H03K 17/00
[52] U.S. Cl. .................................. 307/261; 307/241; 307/269; 328/75
[58] Field of Search ............... 307/261, 311, 254, 260, 307/241, 269; 328/75, 106, 63

[56] References Cited

U.S. PATENT DOCUMENTS

| 3,800,167 | 3/1974 | Smith | 307/261 |
| 4,037,135 | 7/1977 | Novey | 328/75 |
| 4,103,335 | 7/1978 | Vitali | 307/261 |

Primary Examiner—Stanley D. Miller, Jr.
Assistant Examiner—B. P. Davis
Attorney, Agent, or Firm—O'Brien and Marks

[57] ABSTRACT

The present disclosure refers to a sequential logical electronic circuit for operating the discharge gates of a plurality of controllable semiconductors with the object of regulating outputs of said semiconductors which operate as simple contactors that open and close electric circuits of a plurality of phases. The circuit is used to control the power of resistive and inductive circuits, etc., its application being as wide as there are circuits in which it is required to control the discharge of semiconductor elements such as tiristores, triacs, cuadracs, power transistors, etc.

4 Claims, 2 Drawing Figures

SEQUENTIAL LOGICAL ELECTRONIC CIRCUIT CONTROLLING THE DISCHARGE OF CONTROLLABLE SEMICONDUCTORS

BACKGROUND OF THE INVENTION

In the past, there have been developed different forms or methods to control the discharge of controllable semiconductors, the majority of which are derived from the control forms recommended by manufacturers. These methods utilize voltage and current polarizations applied control gates of the controllable semiconductors at precise moments, in order that said semiconductors convey only that portion of the alternating current semicycles that will be used.

In circuits managing monophasic alternating current the control of which is effected by means of such elements as relaxation oscillators, diacs, neon bulbs, etc., a control range of 0 to 100% is attained. In two or three phased currents which are the most difficult to control with precision, monophasic control systems are applied individually to each phase.

For example, in systems where semiconductors of the above mentioned type are used to open or close circuits of one, two or three phases, a certain degree of control has been attained by means of using high frequency pulse trains or by means of a constant application of signals to their gates. Different specific designs are necessary to control the performance of semiconductors which control power circuits.

In the field of specific application relative to the development of devices to open and close electric circuits, that is, in the field of contactors, a wide variety of contactors have been developed for this sole end, ranging from mechanical to low power solid state contactors, known as solid state relays. Power electronic contactors are also well known, of which some activate their power control components (tiristores) by means of a permanent application of control signals to their gates and other ones activate their control components by means of high frequency pulse trains applied to their gates, thus achieving the conduction of different phases of the current at the moment their polarization is adequate.

SUMMARY OF THE INVENTION

An electronic circuit, which sequentially triggers a plurality of controllable semiconductor devices controlling a plurality of sinusoidal power phases, includes circuitry for converting one phase into a square wave signal which is applied to a selectively variable retarding circuit which selects the phase angle at which the semiconductor devices are triggered. Impulses derived from the output of the retarding circuit synchronize a free-running pulse generator and a sequencing circuit driven by the pulse generator. The pulse generator operates at a frequency which is a product of the power frequency multiplied by the number of semicycles or phases controlled by the semiconductor devices. The sequencing circuit has a plurality of outputs which are sequentially energized to control the respective semiconductor devices.

Therefore it is a main object of the invention to design and construct a circuit to control the discharge of semiconductors used in circuits operating with alternating current of one, two or three phases.

It is another object of the invention to construct a circuit with a multiple control action, that is, acting as contactor voltage changer and as a speed control.

It is an additional object of the invention to construct a control circuit wherein a sequence of pulses, having the same sequence and frequency as that of the phase differences between currents of a multiphase power circuit, are applied to respective gates of controllable semiconductors controlling the power circuit only at the moments when the respective half-waves of the alternating currents have polarities such that total or partial conduction of the half-wave is attained.

It is another object of the invention to construct a sequential logical electronic circuit for the discharge control of semiconductors, where said sequence of pulses applied to its gates can be drifted in time relative to line frequency thus selectively obtaining that the power circuit should conduct all or only a fraction of the alternations thus obtaining a voltage control within a range varying from 0 to 100% and consequently a power control from 0 to 100%.

It is yet another object of the invention to construct a control circuit of the above mentioned characteristics, where said discharge control of power circuit semiconductors should be affected by means of pulses in phase with line waves, logically and sequentially processed.

These and other objects and advantages of the invention shall become clear throughout the detailed description of a preferred embodiment of same, which shall take place based on enclosed drawings, where:

Figure 1:
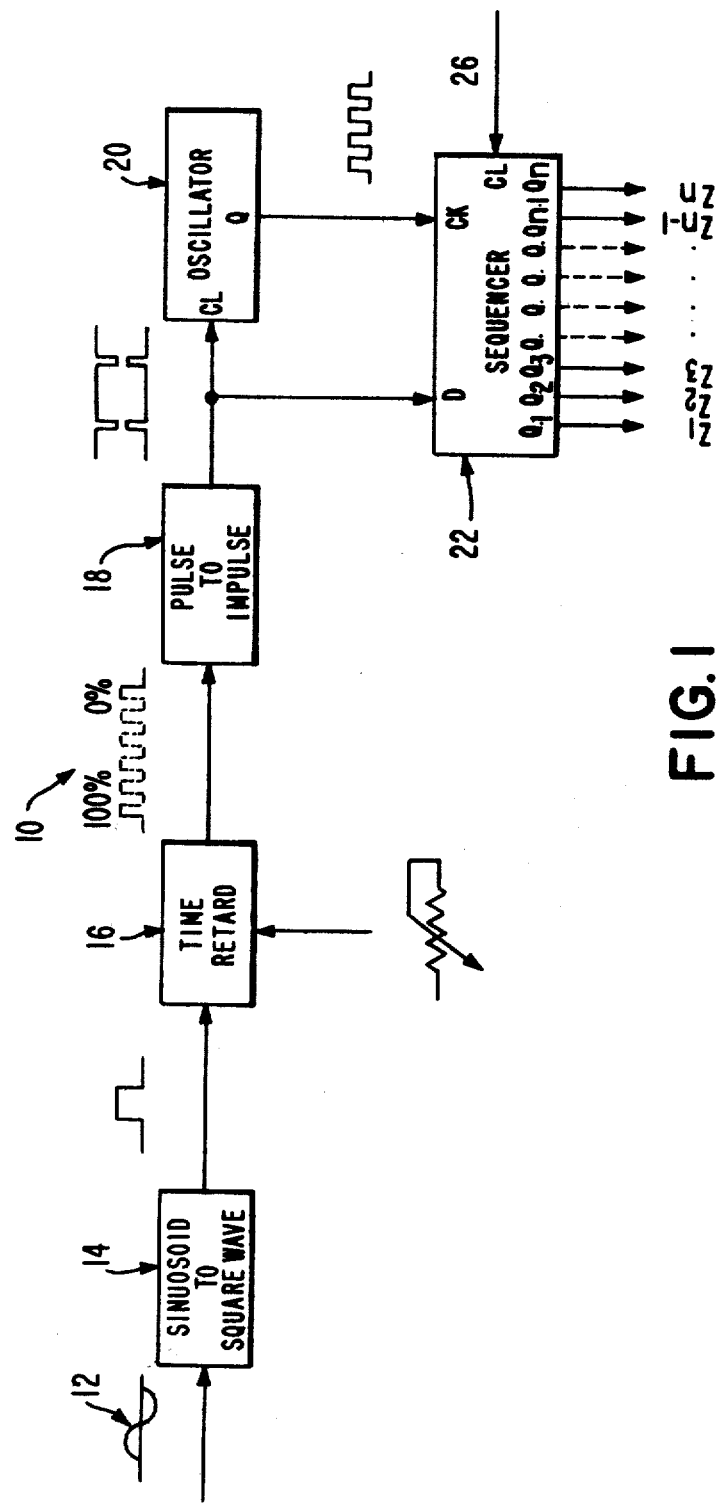
FIG. 1 is a representation in blocks of the circuit object of this application.
Figure 2:
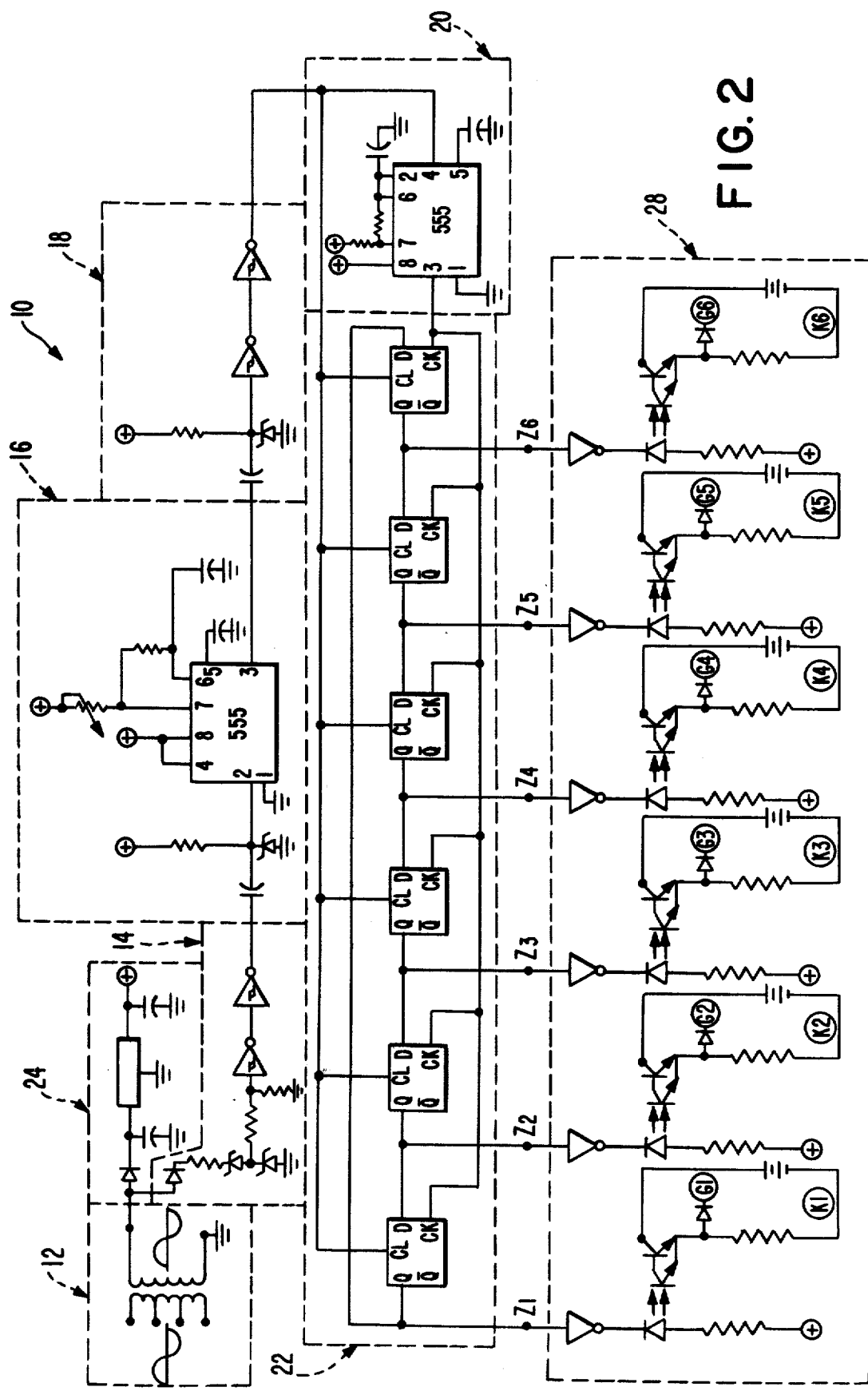
FIG. 2 is a detailed representation of the circuit according to a specific embodiment of the invention.

As is seen in FIGS. 1 and 2 of enclosed drawings in which the control circuit of the invention has been represented with general reference 10, the circuit is fed with alternating current of 110, 220 or 440 volts to the primary of a transformer 12 which provides in its secondary an alternating current of twelve volts, which are shunted into a voltage regulator 24 which constitutes a direct current source of five volts which feeds TTL integrated circuits of control circuit 10.

The output of transformer 12 which is a sinusoidal alternating current feeds converter 14 which transforms sinusoidal waves into square waves, obtaining in its output a "1" logical when sinusoidal wave is at its maximum point, or an "0" logical when said wave is at its minimum point. According to the preferred embodiment of the invention only positive half of the sinusoidal wave of said current is used, obtaining a pulse sequence fed into digital logical circuits of mentioned control circuit.

The preceding signals or logical pulses of converter 14 are fed into time retarding circuit 16, the function of which consists in placing the discharges of the semiconductors of the power circuit at a desired phase angle, said angle being the same for all semi-cycles of controlled phases.

Said time retarding circuit 16 provides an output pulse "1" logical when at its entrance there first appears an "0" logical and provides a normal output of "0" logical when at its input is fed a "1" logical. The pulse width or time retardig variation is selectable in the range from a minimum of 0.0 milli-seconds up to a maximum of 16.66 milli-seconds. The retardation at any intermediate point within the above mentioned range selects the time of the discharges of semiconductors of the power circuit at the control point, or in other words, at the desired angle phase.

In the present control circuit, a circuit for converting pulses into impulses has been identified with reference 18, the input signal of which constitutes the output of time retarder 16 and which responds at its output only when there is a change from "1" logical to "0" logical at its input. Said converter of pulses into impulses presents two outputs, one normally in "1" logical and which derivates a "0" logical impulse and another which is normally in "0" logical and which provides a "1" logical impulse.

Said control circuit also presents a free-running logical pulse generator circuit 20 which provides at its output a certain number or train of pulses between successive impulses which it receives from the converter of pulses into impulses 18. Each train of pulses is synchronized to begin with one of said impulses. In the preferred embodiment, impulses with a line frequency of 60 Hz arrive at this pulse generating circuit and it provides at its output pulses synchronized with these impulses at a frequency of 360 pulses/sec.

A sequential circuit has been identified with reference 22, which receives on the one hand synchronizing impulses from converter 18 and on the other the pulses coming from logical pulse generator 20 in a determined number and synchronized with said impulses. The number of outputs of this sequential circuit is determined by the number of half-waves which it is wished to control, for example, if it is wished to control the six half-waves of three-phase current, six outputs will be required, each one synchronized to a half-wave.

This sequential circuit 22 has, moreover, a deletion input 26 so as to not provide any output when a logical level "1" is present, and thus prevent under such conditions the conduction through the controllable semiconductors of power circuit.

The output signals of the sequential circuit are finally amplified and are modulated by optical couplings before being fed to the gates of said semiconductors.

In reference to FIG. 2 of enclosed drawings, in it is represented in detail the control circuit of the invention, according to a preferred embodiment of same, that is, with the components that form part of it, as well as its functional inter-relation within the circuit. It should be noted that said control circuit 10 is basically constituted by gates and monostable, bistable and non-stable multivibrators as logical circuits. The dotted lines in FIG. 2 represent the different parts or circuits which are represented in the form of blocks in FIG. 1.

As will be obvious and easily discernible by those expert on the art, the herein described control circuit shall be subjected to changes or modifications as regards its components, without necessarily drifting away from the true spirit and scope of this application, therefore the object is that such changes or modifications should be comprised within the scope of the invention as long as the functions of said circuit are not substantially altered; and considering that the foregoing description has been developed in relation to a preferred and specific embodiment of the invention, the scope of this application shall be limited by that claimed in the attached claims.

We claim:

1. A logical electronic circuit for controlling sequentially the discharge of a plurality of controllable semiconductors in multiphase power circuits, comprising:
    a circuit for converting a sinusoidal wave alternating signal from one of the power circuits into a square wave alternating signal which has the same frequency as the sinusoidal signal;
    a time retarding circuit for producing respective pulses in response to the square waves in the square wave signal wherein the pulses have a frequency equal to the sinusoidal signal and have a selected delay in accordance with a desired phase angle at which conduction is to be initiated in one of the semiconductors during all half-cycles of one polarity in the corresponding power circuit;
    a circuit for converting the pulses from the time retarding circuit into impulses;
    a free-running logical pulse generator circuit having an operating frequency which is equal to the product of the frequency of the sinusoidal signal multiplied by the number of half-cycles to be controlled during one cycle of the multiphase power circuits;
    said free-running logical pulse generator having a synchronizing input connected to the pulse-to-impulse converting circuit so that the free-running logical pulse generator generated trains of pulses between the impulses with first pulses of the trains synchronized relative to the impulses;
    a sequential circuit having inputs connected to the free-running logical pulse generator and the pulse-to-impulse converting circuit;
    said sequential circuit having a plurality of outputs corresponding to the number of half-cycles to be controlled and being such that the plurality of outputs are sequentially energised by the pulses of the trains of pulses in a sequence synchronized by the impulses; and
    coupling circuit means for connecting the outputs of the sequential circuit to control electrodes of the semiconductors.

2. A logical electronic circuit according to claim 1, including a transformer coupling the one power circuit to said sinusoidal wave to square wave converting circuit, and wherein said sinusoidal wave to square wave converting circuit enters in its output a logical "1" when said sinusoidal wave is at its maximum point or a "0" logical when said sinusoidal wave is at its minimal point, deriving pulses applied to digital logical circuits of said control circuit.

3. A logical electronic circuit according to claim 1, wherein said time retarding circuit provides said delay in the range from 0 to 16.66 milliseconds with the object of placing the initiation of conduction of the controllable semiconductor of the power circuits at the desired phase angle.

4. A logical electronic circuit according to claim 1, where said circuit converting pulses into impulses, the input signal of which is the output signal of said time retarding circuit, responds at its output only when there is a change from "1" logical to "0" logical at its input.

* * * * *